United States Patent [19]
Oosawa

[11] Patent Number: 6,032,083
[45] Date of Patent: Feb. 29, 2000

[54] SUBSTRATE TRANSFER APPARATUS AND HEAT TREATMENT SYSTEM USING THE SAME

[75] Inventor: Tetsu Oosawa, Sagamihara, Japan

[73] Assignee: Tokyo Electron Limited, Tokyo, Japan

[21] Appl. No.: 08/952,977

[22] PCT Filed: May 29, 1996

[86] PCT No.: PCT/JP96/01442

§ 371 Date: Dec. 8, 1997

§ 102(e) Date: Dec. 8, 1997

[87] PCT Pub. No.: WO96/41371

PCT Pub. Date: Dec. 19, 1996

[30] Foreign Application Priority Data

Jun. 7, 1995 [JP] Japan ................................. 7-140653

[51] Int. Cl.[7] .................................................. G06F 17/00
[52] U.S. Cl. ............................ 700/218; 901/30; 901/35; 901/46
[58] Field of Search ........................ 364/478.06, 478.01; 414/744.8, 744.1, 730; 901/35, 30, 46

[56] References Cited

U.S. PATENT DOCUMENTS

| 5,044,752 | 9/1991 | Thurfjell et al. . |
| 5,383,783 | 1/1995 | Ishimori ................................. 432/253 |
| 5,409,348 | 4/1995 | Suzuki ................................... 414/786 |
| 5,540,098 | 7/1996 | Ohsawa ................................... 73/629 |
| 5,645,391 | 7/1997 | Ohsawa et al. ........................... 414/416 |
| 5,740,059 | 4/1998 | Hirata et al. ........................ 364/478.01 |
| 5,801,764 | 9/1998 | Koizumi et al. .......................... 348/125 |

FOREIGN PATENT DOCUMENTS

| 6-72513 | 3/1994 | Japan . |
| 6-244268 | 9/1994 | Japan . |
| 6-260548 | 9/1994 | Japan . |

*Primary Examiner*—William E. Terrell
*Assistant Examiner*—Khoi H. Tran
*Attorney, Agent, or Firm*—Oblon, Spivak, McClelland, Maier & Neustadt, P.C.

[57] ABSTRACT

A substrate transfer apparatus (20) transfers a substrate between a first substrate support member (21) for supporting a plurality of substrates and a second substrate support member (15). This apparatus (20) includes a transfer apparatus main body (60) movable between a first transfer operation position where it can perform a substrate transfer operation with respect to the first substrate support member, and a second transfer operation position where it can perform a substrate transfer operation with respect to second substrate support member, a substrate receiving member (59b) arranged to be movable back and forth with respect to the transfer apparatus main body to support the substrate and to transfer the substrate to/from the first or second substrate support member, and non-contact sensors (70a, 70b) mounted on two side portions of the substrate receiving member (59b) and movable back and forth integrally with the substrate receiving member to detect a distance to the substrate and a position of the substrate in a horizontal plane.

12 Claims, 12 Drawing Sheets

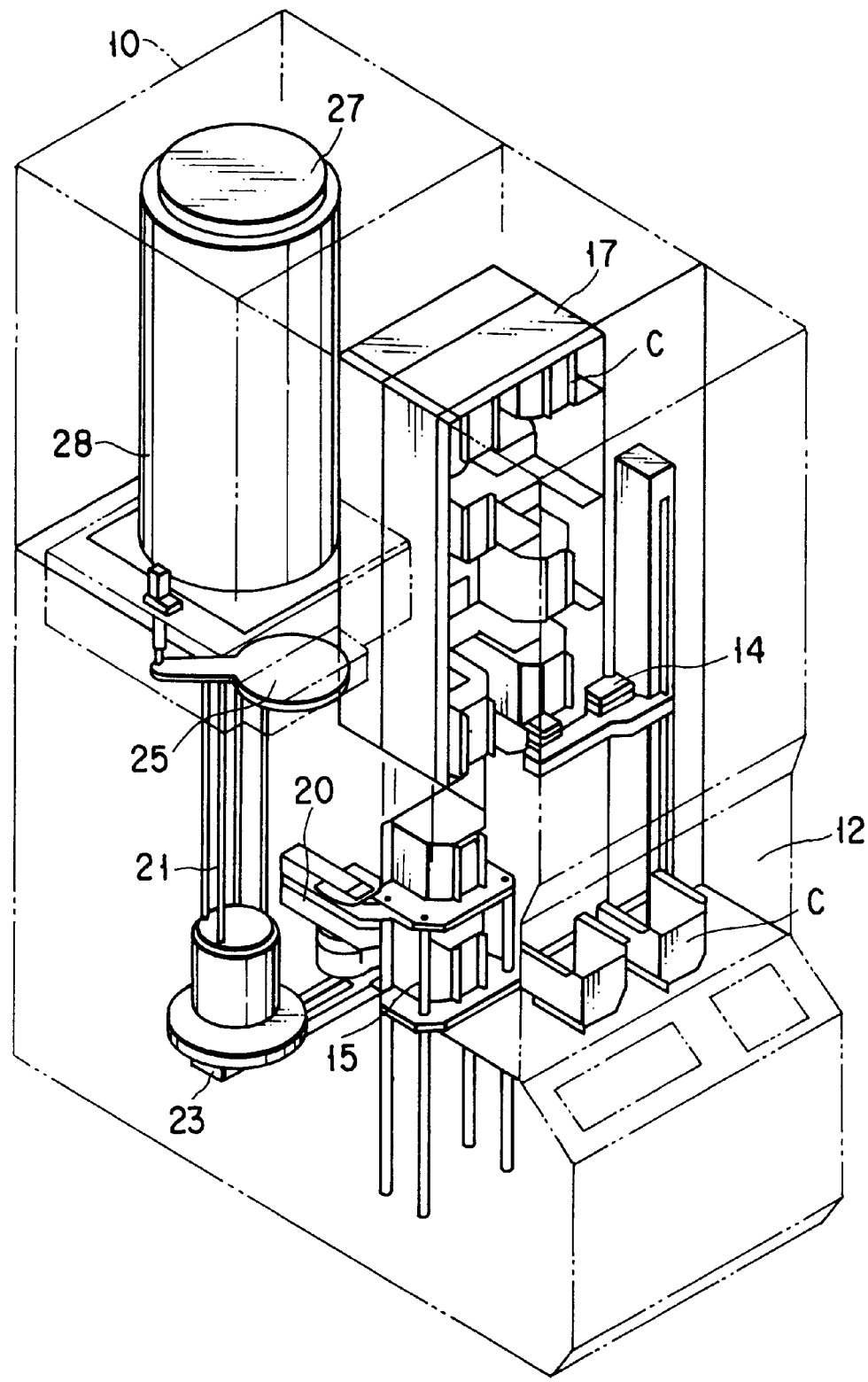
F I G. 1

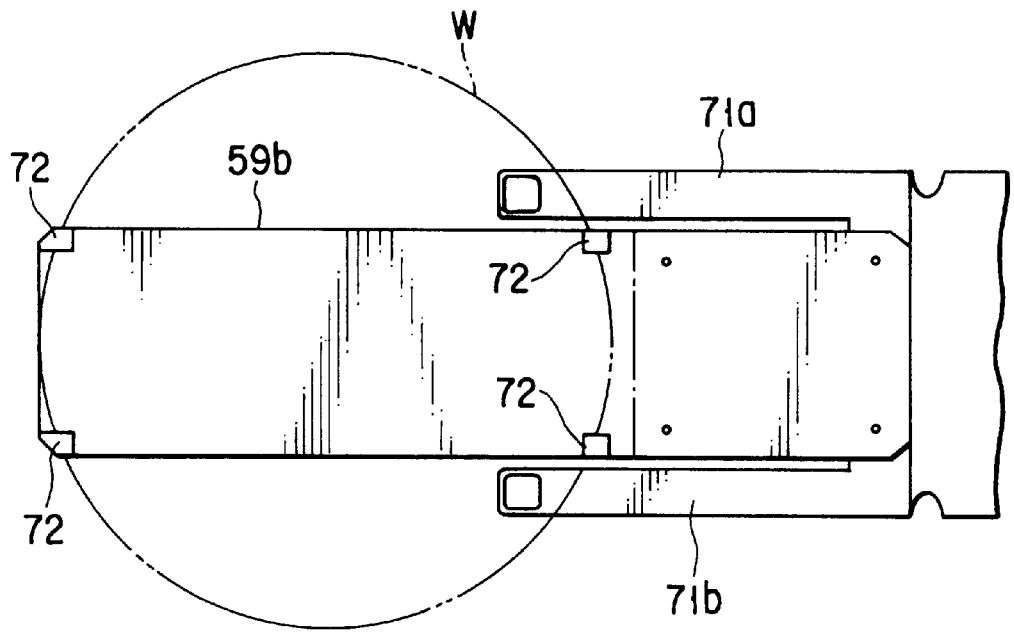
F I G. 6
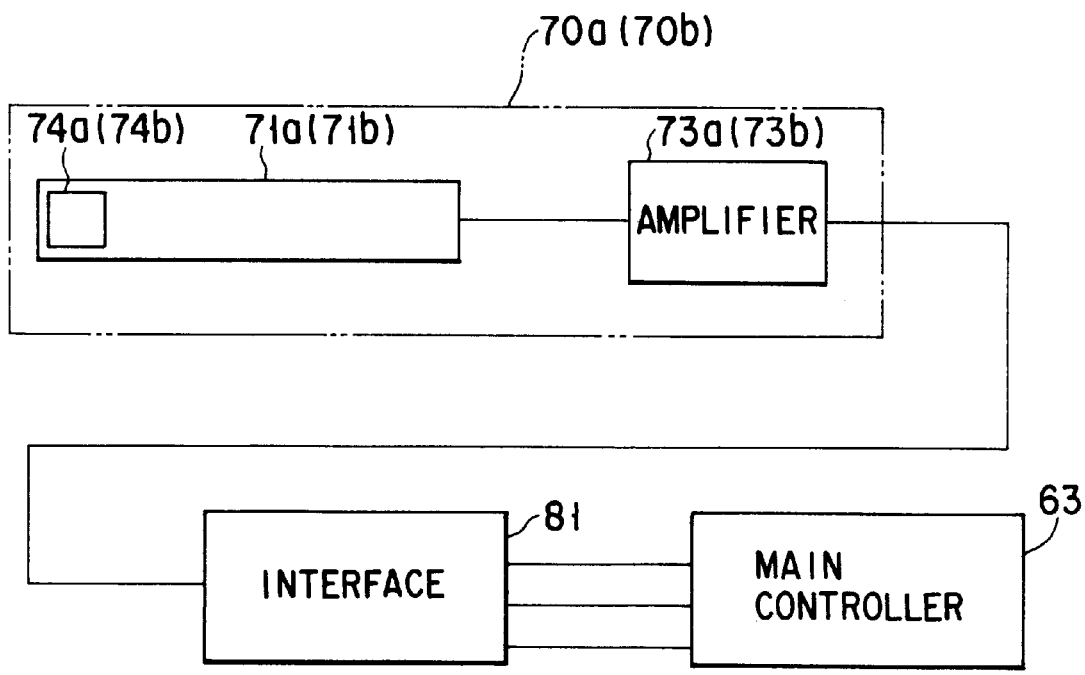
F I G. 7

SUBSTRATE TRANSFER APPARATUS AND HEAT TREATMENT SYSTEM USING THE SAME

TECHNICAL FIELD

The present invention relates to a substrate transfer apparatus for transferring a substrate, e.g., a semiconductor wafer, and a heat treatment system using the same.

BACKGROUND ART

For example, a semiconductor manufacturing process has a step of heat-treating a semiconductor wafer as a substrate. Recently, a heat treatment apparatus which batch-treats a large number of wafers is used in order to effectively achieve required heat treatment. In such a heat treatment apparatus, usually, a wafer boat made of quartz and mounting a large number of wafers thereon is accommodated in a heat treatment chamber, and the wafers are heat-treated in this heat treatment chamber. Regarding this heat treatment, first, the wafers accommodated in a wafer carrier made of a resin, e.g., Teflon, are transferred therefrom onto the wafer boat to be subjected to heat treatment. After predetermined heat treatment is performed, the wafers are transferred from the wafer boat to the wafer carrier.

This wafer transfer operation is performed by a transfer apparatus arranged between the wafer carrier and the wafer boat. In this transfer apparatus, the transfer apparatus main body is moved in the vertical direction and the angular direction in accordance with an operation pattern predetermined by the control mechanism so that it is located at a transfer operation position. Also, a wafer carrying fork serving as a treatment target carrying member arranged in the apparatus main body is moved in the horizontal back-and-forth direction. The wafers are transferred between the wafer carrier and the wafer boat by these operations.

In the actual transfer operation, the fork of the transfer apparatus must perform wafer placing and extracting operations while maintaining an appropriate positional relationship with the target position of the arranged substrate holding member, e.g., the carrier or wafer boat, or with the wafer to be transferred.

The position where the wafer carrier or wafer boat is placed, the posture with which the wafer carrier or wafer boat is placed, and the state of the wafer support grooves are not always the same. More specifically, sometimes the wafer carrier or wafer boat is placed in an inclined state, and various types of displacements may occur in the wafer carrier or wafer boat itself. For example, in the wafer boat, thermal deformation can occur in the heat treatment step. Deformation or strain may occur in the wafer boat due to cleaning performed in order to remove contaminants that attach to the wafer boat during heat treatment. Furthermore, a wafer boat having a specific displacement in itself may be replaced. In the carrier, deformation tends to occur entirely or partly since the carrier is made of a resin.

When various types of these displacements occur in the wafer support member, or when the wafer support state of the wafer support member is inappropriate, the operation position of the fork of the transfer apparatus controlled in accordance with the basic operation pattern is actually relatively displaced from the wafer to be transferred, and the aimed transfer operation cannot be sufficiently performed accordingly. For example, in the wafer extracting operation, sometimes the target wafer cannot be placed on the fork in the aimed state. In the wafer placing operation, sometimes the wafer cannot be accurately inserted, or cannot be inserted at all, in the support groove of the wafer support member.

From these reasons, when a carrier or wafer boat is newly arranged, an operation called teaching is performed so that a transfer operation, which matches it, is performed.

This teaching is an operation of presetting in the apparatus the coordinate values of the respective wafer grooves of the wafer boat and the coordinate values of the wafer support portion of the corresponding carrier. The basic operation pattern of the transfer apparatus is adjusted based on this teaching.

In this case, the groove width of the wafer boat is 3 mm, the thickness of the wafer is 1 mm, and accordingly, the clearance above and below the wafer is as very small as 1 mm. Also, the wafer and the grooves must be absolutely prevented from rubbing with each other. Therefore, high precision of ±0.1 mm is required in teaching.

Since the number of wafers mounted on the wafer boat is as large as 125 to 180, the number of times of operations in one teaching is very large. Also, teaching must be done again every time the boat is thermally deformed or cleaned by the process, leading to a high operation frequency.

This teaching operation is conventionally performed with the visual observation of the operator, and this operation is repeated several times until data having allowable precision is obtained. Even if, however, a certain precision is obtained through repeated operations, as it is done with visual confirmation, it is substantially impossible to realize the required high precision of ±0.1 mm described above. The teaching operation takes time since it is performed in a trial-and-error manner by actually moving the fork little by little while confirming the state through visual observation, leading to a long down time of the apparatus, which is inefficient. Since the result of teaching largely depends on the skill of the operator in charge of teaching and the like, the reproducibility of teaching is low. Further, the position of the wafer mounted on the wafer boat must be recognized accurately. However, a semiconductor wafer processing apparatus, e.g., a heat treatment apparatus, usually has a very small inner space. In confirming a portion in the apparatus that needs checking, the operator cannot but do so in an uncomfortable position. The working environment is poor.

From these reasons, auto-teaching which is done without requiring the operator is developed. As an example of auto-teaching, for example, a technique is known with which a position detection hole is formed in the groove of the wafer boat, the position of the hole is detected by an optical sensor to obtain the position of the boat, and Z-direction positioning that requires particularly high precision is performed.

However, since the boat is generally made of quartz, it is difficult to detect the boat with an optical sensor, so that stable detection cannot be performed. If the light transmittance or reflectance of quartz changes depending on cleaning or the process, or if the boat thermally deforms, auto-teaching cannot cope with this deformation. Furthermore, a large machining cost is required to fabricate such a boat.

In the transfer apparatus for automatically transferring the wafer, a sensor for detecting the presence/absence of the wafer to be transferred is required from a viewpoint different from that in teaching. More specifically, when the fork of the transfer apparatus is inserted in, e.g., the wafer boat, whether a wafer is present above the fork must be detected.

The heat treatment apparatus described above processes expensive wafers, and the wafer boat is also expensive. Accordingly, occurrence of accidents must be prevented. When, however, the distance between the wafer and the wafer groove of the boat is inappropriate, the fork may abut against the boat to push or pull it down, to rub the wafer against the groove portion of the boat, or to break the wafer or fork. A counter-measure that prevents occurrence of accidents is required.

SUMMARY OF THE INVENTION

The present invention has been made under these situations, and has as its object to provide a substrate transfer apparatus which can perform auto-teaching accurately, has a mechanism for detecting presence/absence of the wafer as a unit necessary for automatically transferring the wafer, can transfer a substrate with a high reliability while confirming whether or not the substrate always maintains an appropriate positional relationship with a substrate support member, e.g., a wafer boat or wafer carrier, and can be fabricated at a low cost.

It is another object of the present invention to provide a heat treatment system using this substrate transfer apparatus.

According to an aspect of the present invention, there is provided a substrate transfer apparatus for transferring a substrate between a first substrate support member for supporting a plurality of substrates and a second substrate support member, comprising a transfer apparatus main body movable between a first transfer operation position where the transfer apparatus main body can perform a transfer operation with respect to the first substrate support member, and a second transfer operation position where the transfer apparatus main body can perform a transfer operation with respect to the second substrate support member, a receiving member arranged to be movable back and forth with respect to the transfer apparatus main body to transfer the substrate to/from substrate support portions of the first and second substrate support members, and non-contact sensors mounted on two side portions of the receiving member and movable back and forth integrally with the receiving member to detect a distance to the substrate and a position of the substrate in a horizontal plane.

According to another aspect of the present invention, there is provided a substrate transfer apparatus for transferring a substrate between a first substrate support member for supporting a plurality of substrates and a second substrate support member, comprising a transfer apparatus main body movable between a first transfer operation position where the transfer apparatus main body can perform a transfer operation with respect to the first substrate support member, and a second transfer operation position where the transfer apparatus main body can perform a transfer operation with respect to the second substrate support member, a plurality of receiving members arranged to be movable back and forth with respect to the transfer apparatus main body and vertically stacked to transfer the substrate to/from substrate support portions of the first and second substrate support members, and at least two non-contact sensors respectively mounted on one side portion of at least one of the plurality of receiving members and on a side portion, opposite to the one side portion, of at least one of remaining receiving members and movable back and forth integrally with the receiving members to detect a distance to the substrate and a position of the substrate in a horizontal plane.

According to still another aspect of the present invention, there is provided a heat treatment system comprising a substrate heat treatment section for heat-treating a substrate, a substrate storage section for storing a substrate, and a substrate transfer apparatus for transferring a substrate between the substrate heat treatment section and the substrate storage section, the substrate heat treatment section comprising a heat treatment chamber, a substrate support boat for supporting a large number of substrates, and a loading/unloading mechanism for loading/unloading the substrate support boat into/from the heat treatment chamber, the substrate storage section comprising a storage receptacle for storing a plurality of substrate cassettes for supporting the large number of substrates, and a transport mechanism for transporting a cassette between the storage receptacle and a position corresponding to the transfer apparatus, and the transfer apparatus comprising a transfer apparatus main body movable between a first transfer operation position where the transfer apparatus main body can perform a substrate transfer operation with respect to the substrate support boat, and a second transfer operation position where the transfer apparatus main body can perform a substrate transfer operation with respect to the cassettes, a substrate receiving member arranged to be movable back and forth with respect to the transfer apparatus main body to support the substrate and to transfer the substrate to/from the substrate support boat or the cassette, and non-contact sensors mounted on two side portions of the receiving member and movable back and forth integrally with the substrate receiving member to detect a distance to the substrate and a position of the substrate in a horizontal plane.

According to still another aspect of the present invention, there is provided a heat treatment system comprising a substrate heat treatment section for heat-treating a substrate, a substrate storage section for storing a substrate, and a substrate transfer apparatus for transferring a substrate between the substrate heat treatment section and the substrate storage section, the substrate heat treatment section comprising a heat treatment chamber, a substrate support boat for supporting a large number of substrates, and a loading/unloading mechanism for loading/unloading the substrate support boat into/from the heat treatment chamber, the substrate storage section comprising a storage receptacle for storing a plurality of substrate cassettes for supporting the large number of substrates, and a transport mechanism for transporting a cassette between the storage receptacle and a position corresponding to the transfer apparatus, and the transfer apparatus comprising a transfer apparatus main body movable between a first transfer operation position where the transfer apparatus main body can perform a substrate transfer operation with respect to the substrate support boat, and a second transfer operation position where the transfer apparatus main body can perform a substrate transfer operation with respect to the cassettes, a plurality of substrate receiving members arranged to be movable back and forth with respect to the transfer apparatus main body and vertically stacked to support the substrate and to transfer the substrate to/from the substrate support boat or the cassette, and non-contact sensors mounted on one side portion of at least one of the plurality of substrate receiving members and on a side portion, opposite to the one side portion, of at least one of remaining substrate receiving members and movable back and forth integrally with corresponding ones of the substrate receiving members to detect a distance to the substrate and a position of the substrate in a horizontal plane.

According to one aspect of the present invention, the non-contact sensors are mounted on the two side portions of the substrate receiving member that transfers the substrate to/from the first or second substrate support member, to be movable back and forth integrally with the substrate receiving member to detect the distance to the substrate and the position of the substrate in the horizontal plane. Since the distance to the substrate and the position of the substrate in the horizontal plane can be detected, the positions of the substrate receiving member and the target substrate relative to each other can be grasped as three-dimensional data, so that auto-teaching can be performed at high precision. Since the distance to the substrate is detected by the sensors, the presence/absence of the substrate and whether or not the positional relationship between the substrate and the receiving member is accurately maintained can be confirmed, so that the substrate can be transferred at high reliability. Since the sensors only need be mounted on the two sides of the fork, fabrication is easy and its cost is low.

According to another aspect of the present invention, the plurality of substrate receiving members are arranged to be vertically stacked. Non-contact sensors are mounted on one side portion of at least one of the plurality of substrate receiving members and on a side portion, opposite to the one side portion, of at least one of remaining substrate receiving members, to be movable back and forth integrally with the substrate receiving members to detect the distance to the substrate and the position of the substrate in the horizontal plane. Since the distance to the substrate and the position of the substrate in the horizontal plane are detected, the positions of the substrate receiving members and the target substrate relative to each other can be grasped as three-dimensional data, and the same effect as that described above can be obtained.

BRIEF DESCRIPTION OF DRAWINGS

FIG. 1 is a perspective view showing an example of a heat treatment system for a semiconductor wafer to which a substrate transfer apparatus according to the present invention is applied;

FIG. 6 is a plan view showing the arrangement of a receiving plate used in the transfer apparatus of the present invention;

FIG. 7 is a diagram showing the connection state between a controller and an electrostatic capacity sensor mounted on the receiving plate used in the transfer apparatus of the present invention;

BEST MODE OF CARRYING OUT THE INVENTION

The present invention will be described in detail with reference to the accompanying drawings. A case will be described wherein semiconductor wafers are employed as the substrates and a wafer carrier and a wafer boat are employed as the substrate support members.

Figure 2:
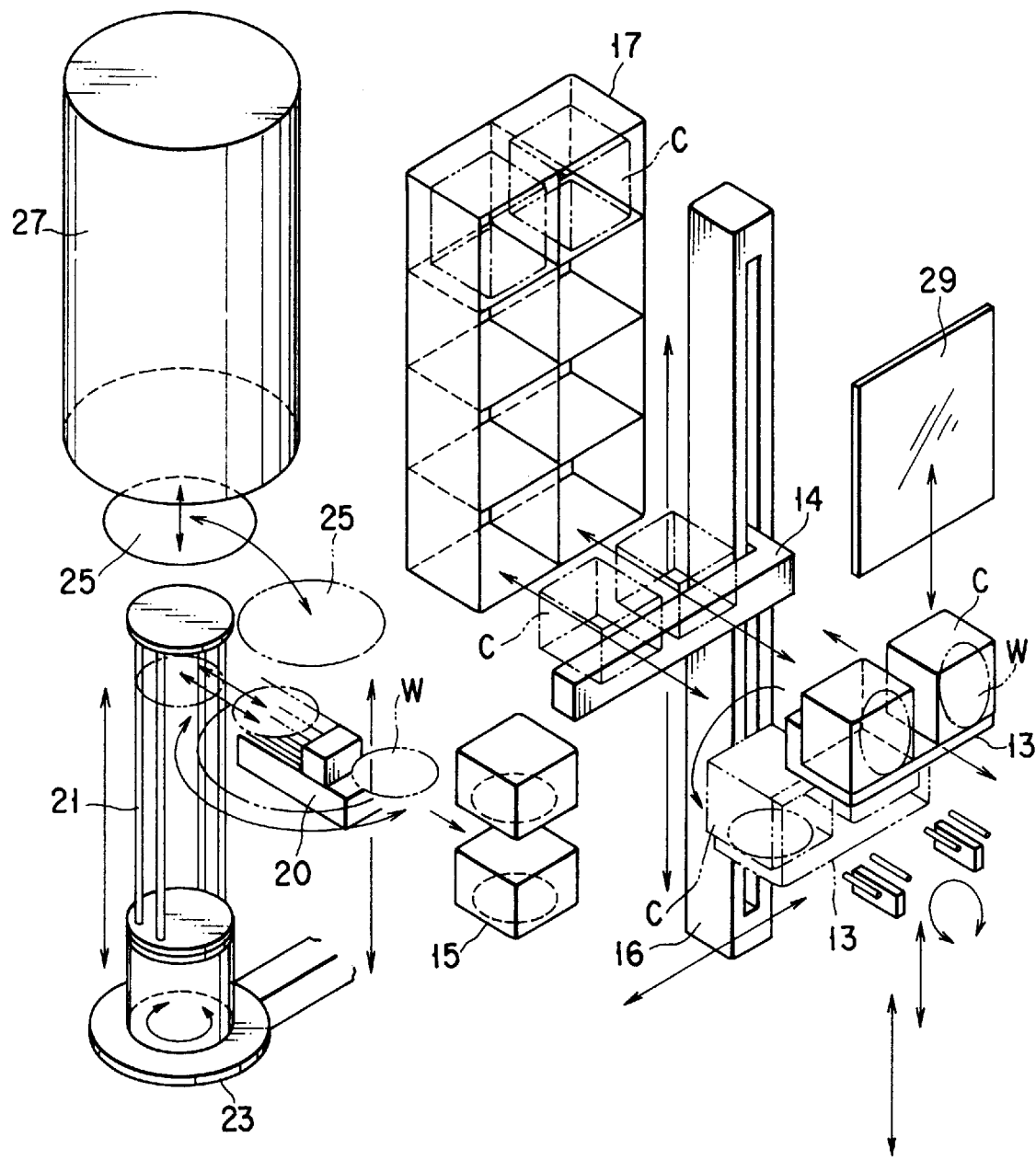
FIG. 2 is a perspective view for explaining transfer operation of a semiconductor wafer in the heat treatment apparatus of FIG. 1.

FIG. 1 is a perspective view showing an example of a heat treatment apparatus to which a substrate transfer apparatus according to the present invention is applied, and FIG. 2 is a perspective view for explaining movement of a semiconductor wafer in this heat treatment apparatus.

This heat treatment system 10 basically comprises a heat treatment chamber 27 for heat-treating wafers, a boat elevator 23 for loading/unloading a wafer boat 21 having wafers thereon into/from the heat treatment chamber 27, a carrier stocker 17 for stocking carriers C storing the wafers, and a transfer apparatus 20 for transferring the wafers from the carriers C to the wafer boat 21. In this heat treatment system 10, carriers C each storing, e.g., 25 wafers W, are placed on a direction switching mechanism 13 at an inlet/outlet port 12. The direction of the carriers C is switched by the direction switching mechanism 13 by 90°. Subsequently, the carriers C are loaded on a transport stage 15 by a carrier transport mechanism 14 or in the carrier stocker 17 by a carrier elevator 16. Thereafter, the wafers W in the carriers C on the transport stage 15 are transferred on the wafer boat 21 by the transfer apparatus 20. Reference numeral 29 in FIG. 2 denotes an auto-door 29 for opening/closing the inlet/outlet port 12.

The wafer boat 21 supporting a predetermined number of wafers W thereon is moved upward by the wafer boat elevator 23 and is inserted in the heat treatment chamber 27 through its lower end which is open upon opening a cap 25. Then, the lower end of the chamber 27 is closed with the cap 25, and the wafers W are heat-treated in this heat treatment chamber 27 with heat from a heater 28.

When predetermined heat treatment is ended, the wafer boat 21 is moved downward from the heat treatment chamber 27 to the original position, and the wafers W on the wafer boat 21 are transferred on the carriers C on the transport stage 15 by the transfer apparatus 20.

Support grooves for supporting the large number of wafers W to be stacked through gaps are formed in the wafer boat 21 or carriers C at predetermined pitches to be separate from each other. For example, the opening width of the support grooves of the wafer boat 21 is, e.g., 2 mm when 8-inch wafers having a thickness of 0.725 mm are to be supported, and is, e.g., 1.5 mm when 6-inch wafers having a thickness of 0.65 mm are to be supported.

Figure 3:
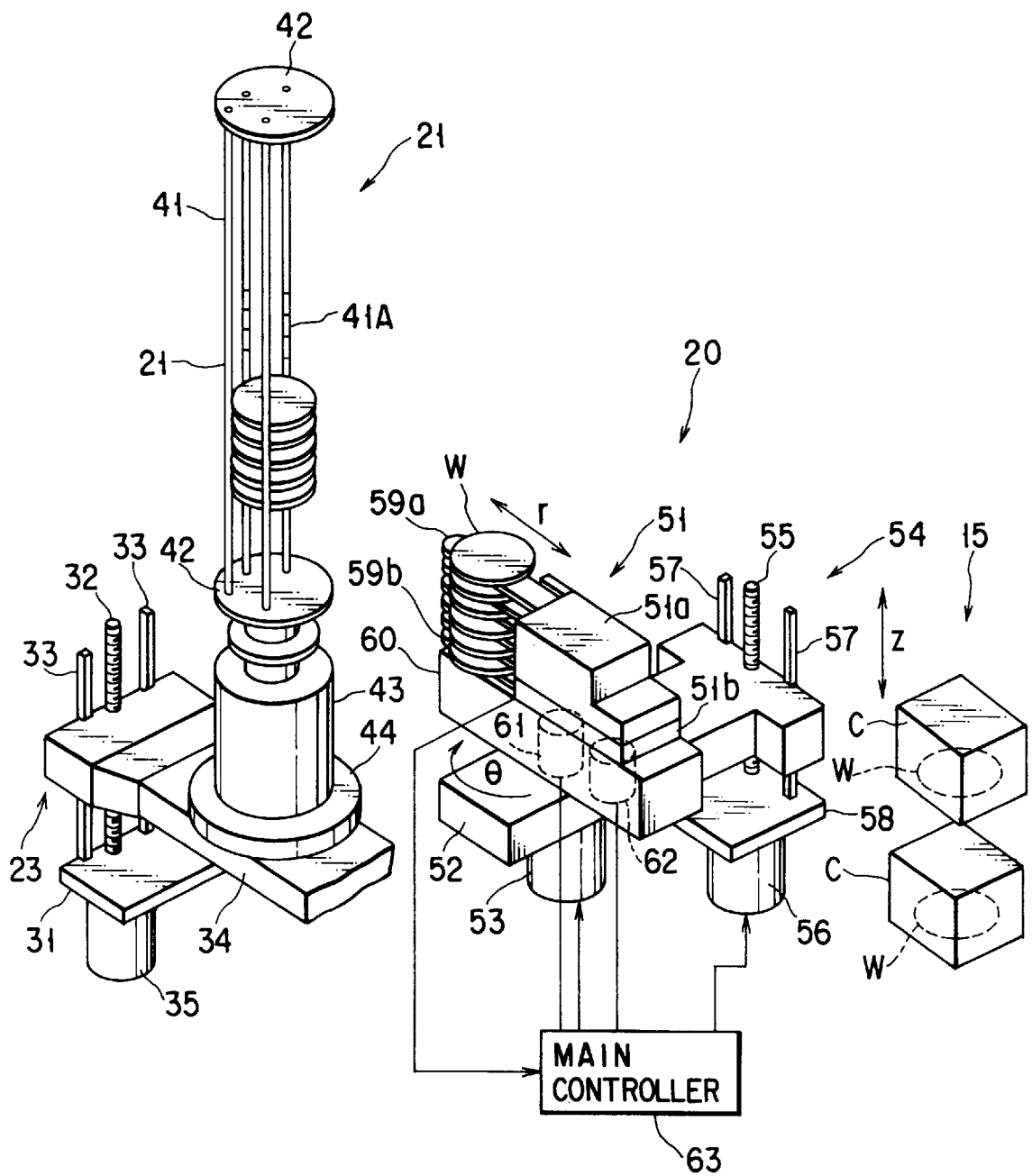
FIG. 3 is a perspective view showing a state wherein wafers are transferred from a wafer carrier to a wafer boat and vice versa by using a transfer apparatus according to an embodiment of the present invention.

FIG. 3 is a perspective view showing a state wherein the wafers are transferred from the wafer carrier to the wafer boat and vice versa by using a transfer apparatus according to an embodiment of the present invention. As shown in FIG. 3, the transfer apparatus 20 is located between the carriers C on the transport stage 15 and the wafer boat 21 on the wafer elevator 23.

The wafer boat elevator 23 has a work table 34 on which the wafer boat 21 is placed, a vertically extending ball screw 32 threadably engaging with the work table 34, a motor 35 for rotating the ball screw 32, vertically extending linear guides 33 for guiding the work table 34, and a support plate 31 for supporting the linear guides 33. When the ball screw 32 is rotated by the motor 35, the work table 34 is vertically moved along the linear guides 33. By this vertical movement, the wafer boat 21 storing the substrates is loaded into and unloaded from the heat treatment chamber 27.

The wafer boat 21 is made of a material, e.g., quartz, having excellent heat resistance and corrosion resistance, and has four support columns 41 each having 125 to 180 grooves 41A, a pair of circular plates 42 for fixing the upper and lower end portions of the four support columns 41, a heat-insulating cylinder 43 mounted under the lower circular plate 42, and a flange 44 arranged on the lower end of the heat-insulating cylinder 43.

When the wafer boat 21 is loaded in the heat treatment chamber 27, the flange 44 comes into contact with the flange of the manifold, thereby closing the interior of the heat treatment chamber 27.

The transfer apparatus 20 has an arm portion 51 for placing the wafers thereon, a support table 52 for supporting the arm portion 51 to be pivotal along a θ direction in a horizontal plane, a motor 53 for pivoting the arm portion 51 along the θ direction, and a drive mechanism 54 for vertically moving the support table 52. The drive mechanism 54 has a vertically extending ball screw 55 fixed to the support table 52, a motor 56 for rotating the ball screw 55, vertically extending linear guides 57 for guiding the support table 52, and a support plate 58 for supporting the linear guides 57. When the ball screw 55 is rotated by the motor 56, the support table 52 is vertically moved along the linear guides 58, i.e., in the Z direction. The arm portion 51 has an upper portion 51a and a lower portion 51b that are supported on a base portion 60. The upper portion 51a and lower portion 51b of the arm portion 51 have five receiving plates 59a and one receiving plate 59b, respectively. The five receiving plates 59a can be moved forward/backward at once by a motor 61 in the back-and-forth direction, i.e., in a direction r in FIG. 3. The receiving plate 59b can be moved forward/backward by a motor 62 in the direction r. These receiving plates 59a and 59b serve as wafer carrying members, and receive and carry the wafers W when they are transferred. The motors 61 and 62 are incorporated in the base portion 60.

This transfer apparatus 20 can receive and deliver the wafers W at a desired position through movement of the support table 52 in the Z direction, movement of the arm portion 51 in the θ direction, and movement of the receiving plates 59a and 59b in the r direction.

Sensor heads (to be described later) are mounted on the two sides of the receiving plates 59a and 59b. Detection signals from the sensor heads are output to a main controller 63, and control signals are output from the main controller 63 to the respective drive units of the transfer apparatus 20.

Figure 4:
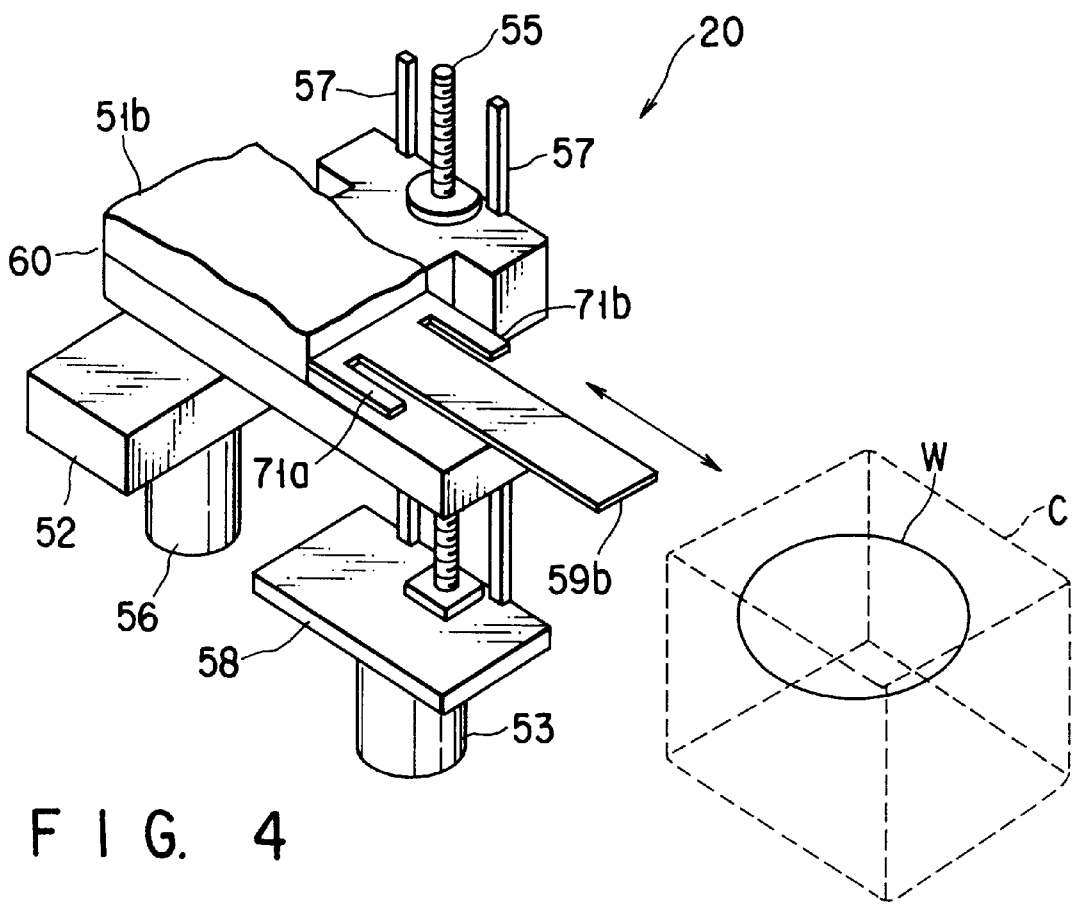
FIG. 4 is a perspective view for explaining an operation of extracting the wafer from the wafer carrier with the transfer apparatus according to the embodiment of the present invention.
Figure 5:
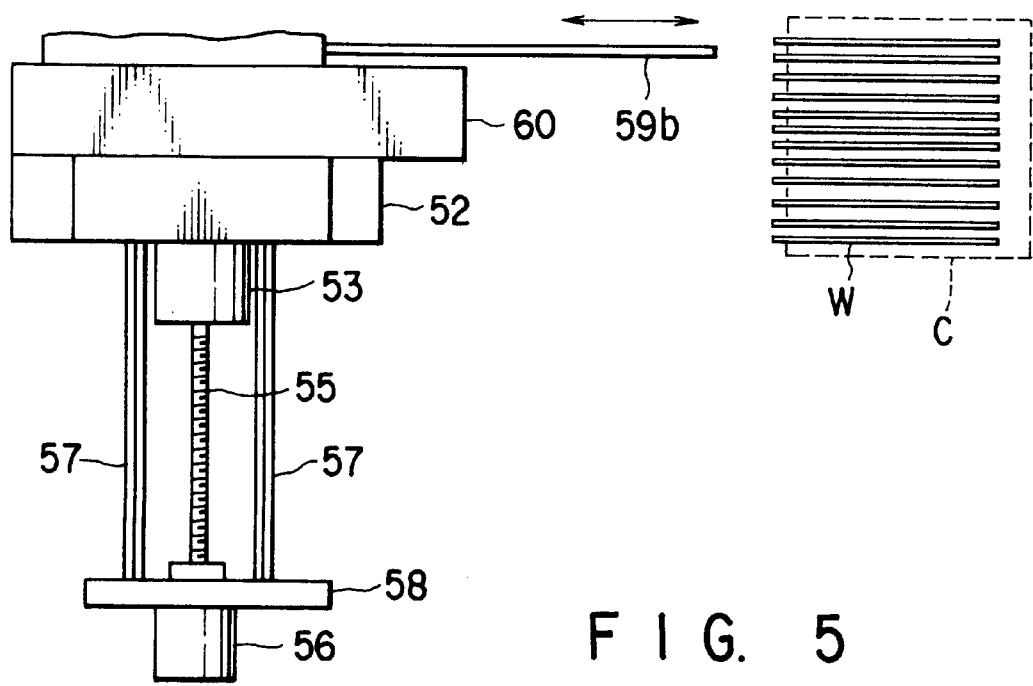
FIG. 5 is a side view for explaining the operation of similarly extracting the wafer from the wafer carrier.

The operation of the transfer apparatus 20 will be described with reference to FIGS. 4 and 5 by way of the operation of extracting the wafers W stored and supported in the carriers C. Although an explanation will be made only regarding the receiving plate 59b for the sake of simplicity, the receiving plates 59a are operated in the same manner. Sensor heads 71a and 71b (to be described later) are mounted on the two sides of the receiving plate 59b.

To extract a wafer stored in the carrier C, first, the Z-direction position of the support table 52 is adjusted by the drive mechanism 54, and the θ-direction position of the support table 52 is further adjusted by the motor 53, so that the arm portion 51 precisely opposes the carrier C. Subsequently, the receiving plate 59b is moved forward to receive the wafer W, and is moved backward.

The structure of the receiving plate 59b will be described in detail with reference to FIGS. 6 and 7. The receiving plates 59a are arranged completely in the same manner as the receiving plate 59b.

FIG. 6 is a plan view of the receiving plate 59b, and FIG. 7 is a view showing the connection state between the receiving plate 59b and a controller. The main body of the receiving plate 59b is made of, e.g., alumina or silicon carbide. Holding members 72 for holding the wafer W at, e.g., four points, are arranged on the upper surface of the receiving plate 59b.

The sensor heads 71a and 71b mounted on the two sides of the receiving plate 59b are respectively connected to amplifiers 73a and 73b. The sensor heads 71a and 71b, and the amplifiers 73a and 73b constitute electrostatic capacity sensors 70a and 70b serving as non-contact sensors.

The electrostatic capacity sensors 70a and 70b respectively measure the capacitances between sensor portions 74a and 74b formed at their distal ends, and the wafer W. A signal corresponding to the distance is output from the amplifier 73 in accordance with the measured capacitance and input to an interface 81. The interface 81 interprets the signal corresponding to the distance output from the amplifier 73 in accordance with the value given in advance or reference supplied from the main controller, and outputs information indicating the presence/absence of the wafer W, information concerning whether or not the wafer W and the receiving plate are maintained at an appropriate distance, and information for auto-teaching to the main controller 63 as ON/OFF signals. The main controller 63 outputs a control signal to the drive system of the transfer apparatus 20 based on the input information, thereby controlling the operation of the transfer apparatus 20.

Figure 8:
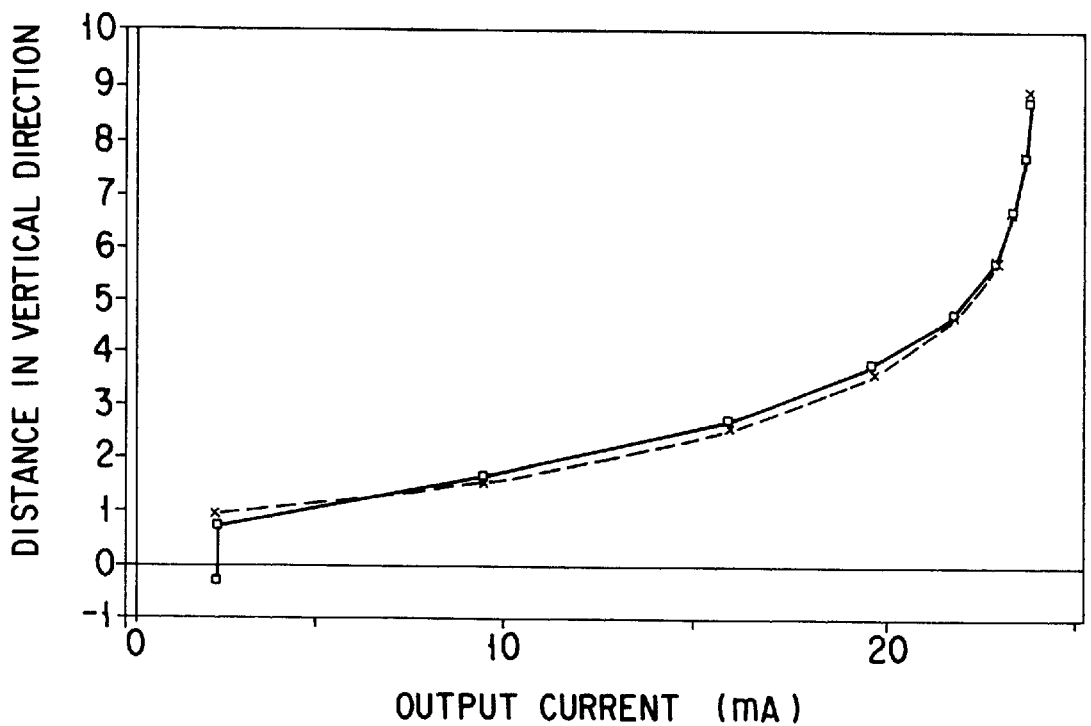
FIG. 8 is a graph showing a change in output of the electrostatic capacity sensor used in the transfer apparatus of the present invention, which is obtained when a sensor head is moved close to the wafer.

FIG. 8 is a graph showing a change in sensor output obtained when the sensor head is moved close to the wafer W. Since the detection value is proportional to the inverse of the distance due to the detection principle of the electrostatic capacity sensor, on the near-distance side, the output changes largely even if a change in distance is small. This fact is confirmed from FIG. 8. As a result, high-precision measurement is realized on the near-distance side. From FIG. 8, it is confirmed that high-precision measurement can be performed until the distance between the sensor and wafer is up to 4 mm to 5 mm.

Figure 9:
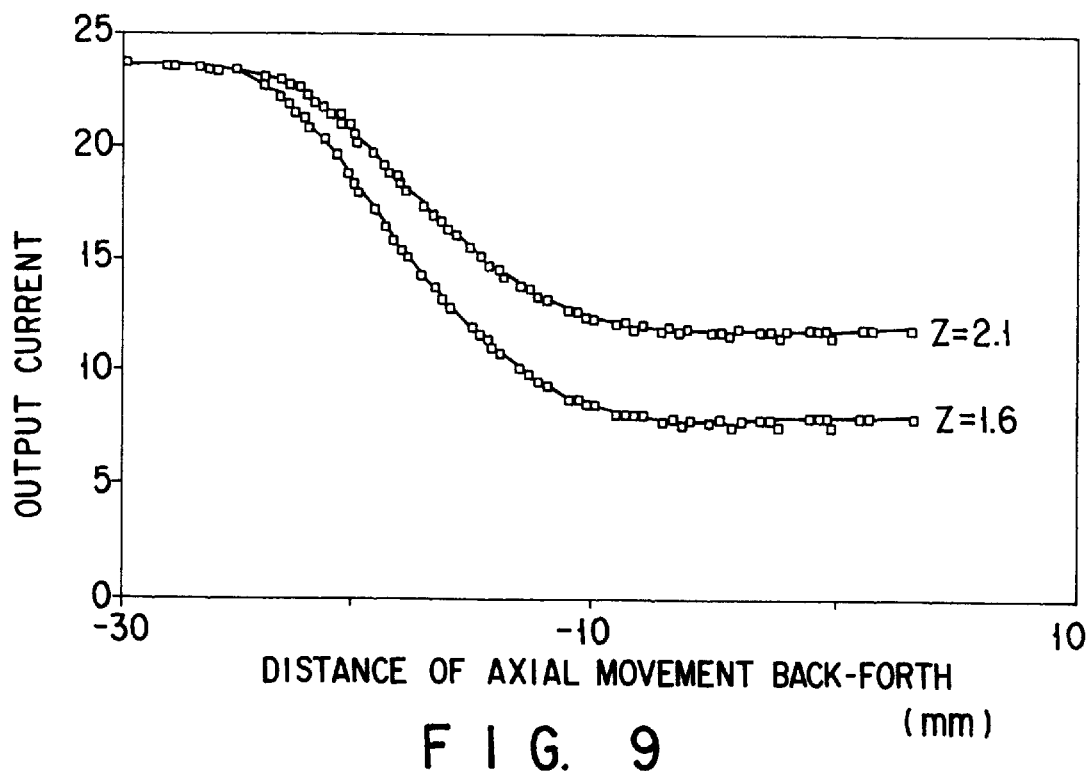
FIG. 9 is a graph showing a change in output of the electrostatic capacity sensor, used as a non-contact sensor in the transfer apparatus of the present invention, while the receiving plate is driven in the back-and-forth axial direction, after the sensor head is maintained at a position under the wafer to be remote from it by a predetermined distance, to extract the sensor head from under the wafer.

FIG. 9 is a graph showing a change in sensor output obtained while the receiving plate is driven in the back-and-forth axial direction, after the sensor head is maintained at a position under the wafer to be remote from it by 1.6 mm and 2.1 mm, to extract the sensor head from under the wafer. From FIG. 9, it is known that in both cases the sensor output changes when the sensor head passes by the outer periphery of the wafer. In other words, if a threshold value is set in the sensor, a position of the outer peripheral portion of the wafer is measured as the back-and-forth axial moving amount of the receiving plate.

From the above facts, the sensor that originally measures the distance in the vertical direction can be apparently used to measure a position in the horizontal direction through the emphasizing operation with the drive axis in the horizontal direction.

The thickness of the sensor head is preferably equal to or smaller than the thickness of the receiving plate so that the sensor head will not abut against other members when moving the receiving plate. Since the thickness of the receiving plate is normally 1.05 mm to 2 mm, the thickness of the sensor head is preferably about 1 mm to 2 mm.

The main controller 63 processes the information concerning the presence/absence of the wafer W, the information as to whether the wafer W and the receiving plate are at an appropriate distance, and the information for auto-teaching, which are obtained by the interface 81 based on the signals from the electrostatic capacity sensors 70a and 70b, thereby controlling the operation of the transfer apparatus 20.

Figure 10:
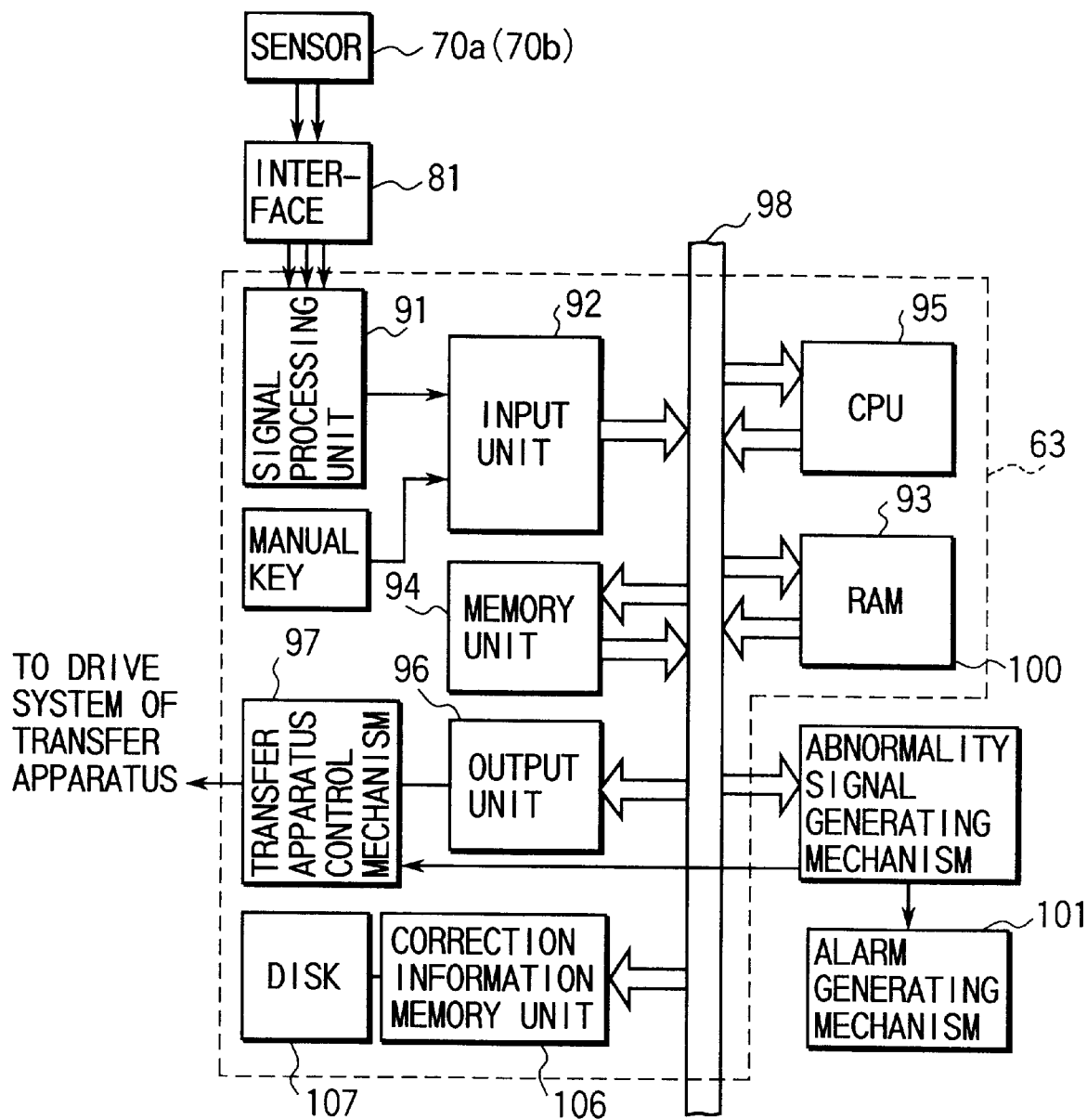
FIG. 10 is a block diagram showing a main controller for controlling the substrate transfer apparatus based on information from the non-contact sensor.

As shown in FIG. 10, the main controller 63 has a signal processing unit 91, an input unit 92, a RAM 93, a memory unit 94, a CPU 95, an output unit 96, a transfer apparatus control unit 97, a manual key 105, a correction information memory unit 106, a disk 107, and the like. Reference numeral 98 denotes a bus line. The main controller 63 is connected to an abnormality signal generating mechanism 100 and an alarm generating mechanism 101 so that an abnormality can be detected.

In this main controller 63, a signal from the interface 81 is sent to the input unit 92 as an appropriate signal through the signal processing unit 91, and information from the input unit 92 is loaded in the RAM 93. The memory unit 94 stores reference information. The CPU 95 compares the detection information and reference information. A command based on this comparison result is output to the transfer apparatus control mechanism 97 through the output unit 96, thereby controlling the operation of the transfer apparatus 20.

In an ordinary transfer operation, when a signal from the interface 81 guarantees the presence/absence of a wafer and that the wafer maintains an appropriate position, a transfer operation continues.

When a signal from the interface 81 indicates an abnormality, that is, when the wafer is not in a supposed state or the wafer is not located at an appropriate position, an abnormality signal is output from the abnormality signal generating mechanism 100 to the transfer apparatus control mechanism 97 to stop the operation of the transfer apparatus 20. This signal is also output to the alarm generating mechanism 101 to generate an alarm. After the apparatus is stopped, the main controller 63 loads the signal from the interface 81 again, displays the cause of the abnormality on the display screen (not shown), and waits for the operator's designation.

Auto-teaching done by the transfer apparatus 20 will be described.

To realize auto-teaching, the relative positions of the wafer transfer apparatus and target wafer must be fetched as three-dimensional data. More specifically, Z-direction data: vertical direction X-direction data: back-and-forth axial direction of the receiving plate Y-direction data: θ direction When an electrostatic capacity sensor is used, the Z-direction data can be measured directly. Data conversion of X- and Y-direction positions are performed in the following manner. If the wafer is offset, the position of the outer periphery detected by the sensor displaces. The offset amount of the wafer is obtained from the displacement amount from the regular position in the opposite manner. More specifically, (1) X-direction data=average of data on two positions on the outer periphery (average of the x-direction data of the two sensors)

(2) Y-direction data=(difference between data of the two positions on the outer periphery)/1.218 Namely, (difference between X-direction data of the two sensors)/1.218

FIG. 11 and FIGS. 12A to 12D show this.

Figure 11:
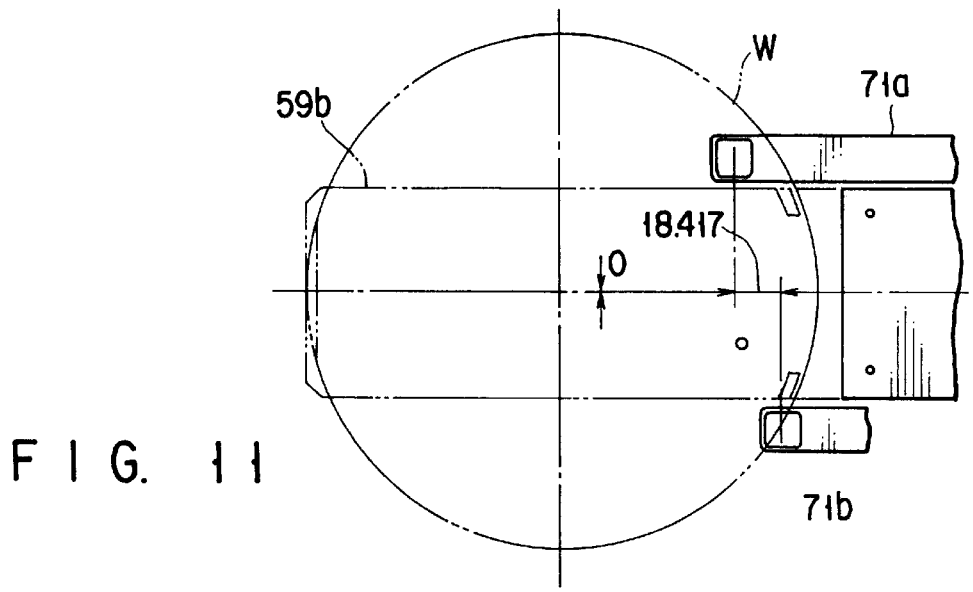
FIG. 11 is a view showing a method of data conversion of an X-direction position when auto-teaching is performed by the transfer apparatus of the present invention.
Figure 12A:
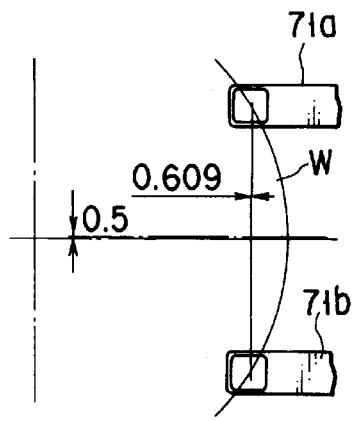
FIGS. 12A to 12D are views showing a method of data conversion of a Y-direction position when auto-teaching is performed by the transfer apparatus of the present invention.
Figure 12C:
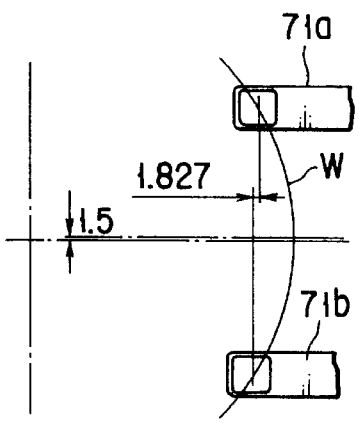
Figure 12B:
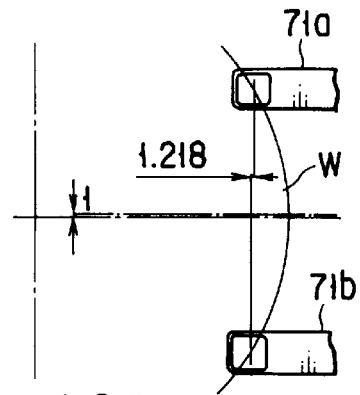
Figure 12D:
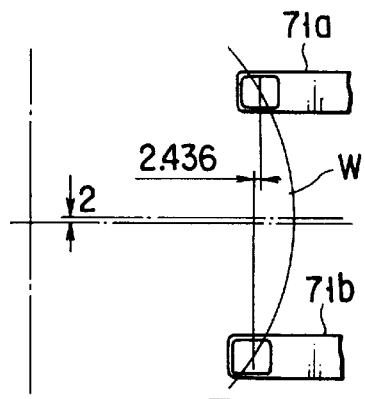

FIG. 11 shows a method of data conversion of an X-direction position, and indicates a state wherein when one sensor detects the outer peripheral portion of the semiconductor wafer, the other one is offset in the X direction by 18.417 mm. In FIG. 11, for the sake of illustrative convenience, the sensor seems to be offset from the semiconductor wafer.

FIGS. 12A to 12D show a method of data conversion of a Y-direction position, and indicates a change between X-direction data of the two sensors obtained when the respective sensors detect the outer peripheral portion of the semiconductor wafer. In FIGS. 12A to 12D, the differences between X-direction data are 0.609 mm, 1.218 mm, 1.827 mm, and 2.436 mm, respectively. Offset amounts in the Y direction obtained from these differences are 0.5 mm, 1 mm, 1.5 mm, and 2 mm.

A case wherein sensors are arranged on the two sides of one mounting receiving plate of the transfer apparatus is described above. However, sensors may be arranged on one side portion of at least one of a plurality of receiving plates and on a side portion, opposite to the one side portion, of at least one of the remaining receiving plates.

Figure 13:
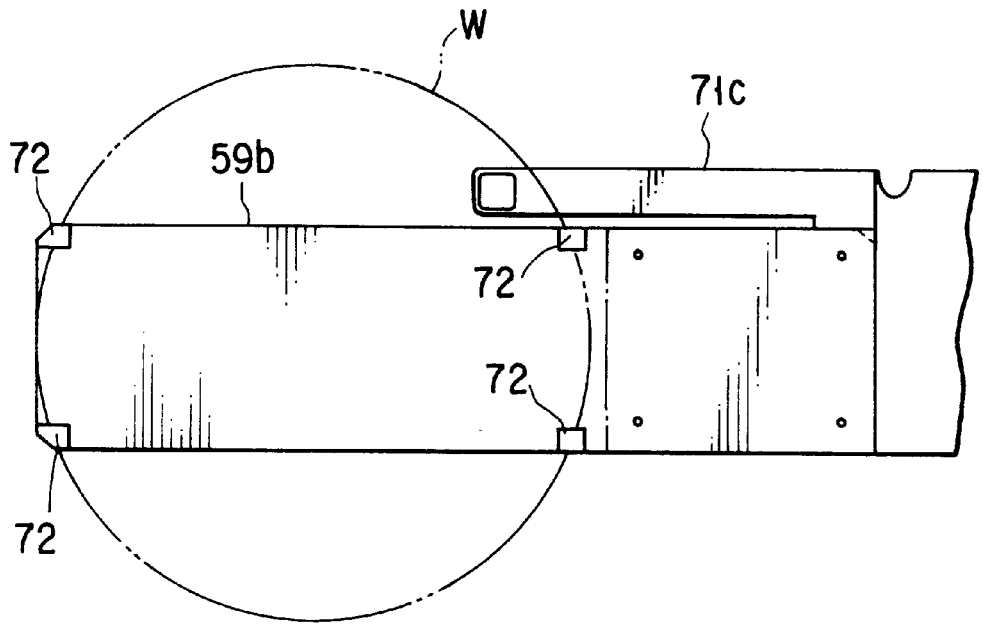
FIGS. 13 and 14 are views respectively showing other examples of the receiving plate used in the present invention.
Figure 14:
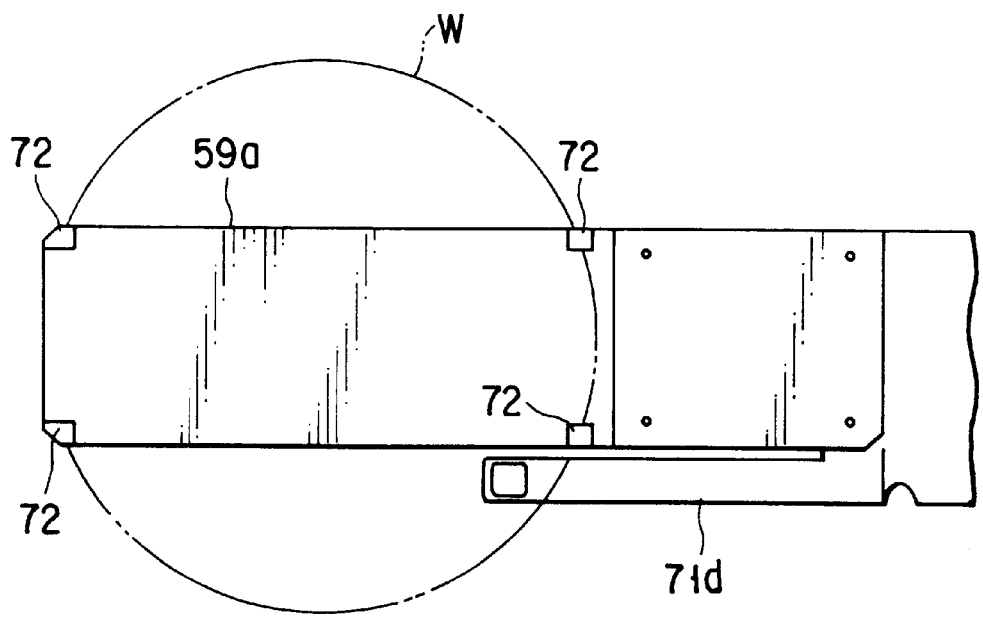

For example, as shown in FIG. 13, a sensor head 71c can be mounted on only one side portion of the receiving plate 59b described above, and as shown in FIG. 14, a sensor head 71d can be mounted on only a side portion, opposite to the one side portion, of at least one of the receiving plates 59a. This can reduce the number of sensors.

When auto-teaching is performed by the transfer apparatus having this arrangement, if the sensor located at a lower position is moved upward and used, two types of data can be fetched in the same manner as in a case wherein sensors are arranged on the two sides.

Figures 15A, 15B:
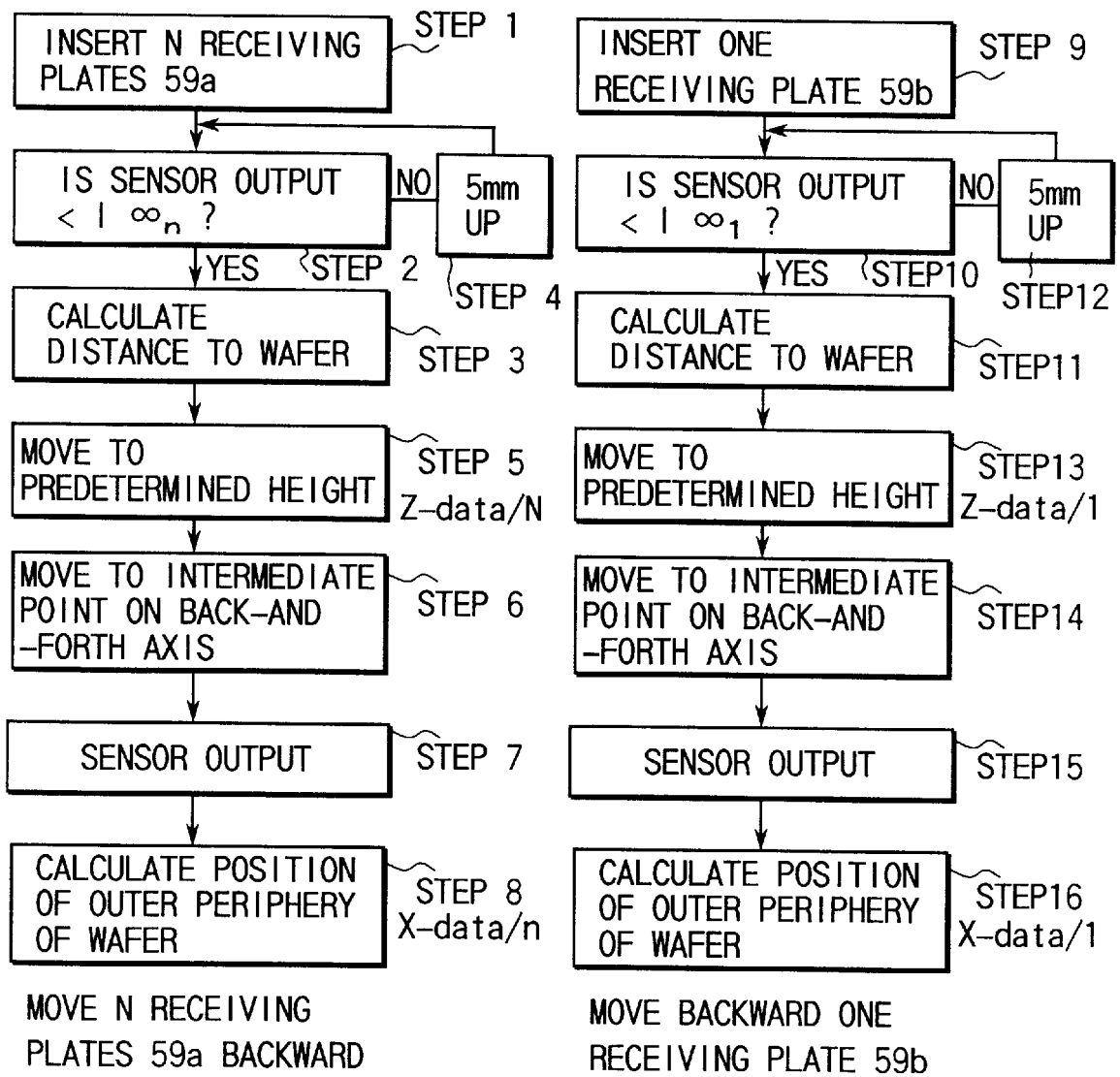
FIGS. 15A and 15B are flow charts for respectively explaining a flow employed when auto-teaching is performed by using the receiving plates shown in FIGS. 13 and 14.

FIGS. 15A and 15B show the teaching operation at this time.

First, as shown in FIG. 15A, a plurality of (n) receiving plates 59a are respectively inserted under the wafers in a safe state (step 1). A sensor output is confirmed (step 2). If the obtained value is within a predetermined range, a distance to the wafer is calculated (step 3). If the calculated value does not reach the lower limit of the predetermined range, the receiving plates are moved upward by, e.g., 5 mm (step 4), and step 2 is performed again. This operation is repeated until the calculated value reaches a predetermined value. Then, the receiving plates are moved to a predetermined height, and Z-direction data (Z-data/n) is obtained (step 5). Thereafter, the n receiving plates 59a are moved to the intermediate point in the back-and-forth axial direction (step 6), and a sensor output obtained at this time is grasped (step 7). The position of the outer periphery of the wafer is calculated based on this data, thus obtaining X-direction data (X-data/n) (step 8).

Subsequently, as shown in FIG. 15B, one receiving plate 59b is inserted under the wafer in a safe state (step 9). A sensor output is confirmed (step 10). If the obtained value is within a predetermined range, a distance to the wafer is calculated (step 11). If the calculated value does not reach the lower limit of the predetermined range, the receiving plate is moved upward by, e.g., 5 mm (step 12), and step 10 is performed again. This operation is repeated until the calculated value reaches a predetermined value. Then, the receiving plate is moved to a predetermined height, and Z-direction data (Z-data/1) is obtained (step 13). Thereafter, the receiving plate 59b is moved to the intermediate point in the back-and-forth axial direction (step 14), and a sensor output obtained at this time is grasped (step 15). The position of the outer periphery of the wafer is calculated based on this data, thus obtaining X-direction data (X-data/1) (step 16).

Data conversion is performed in the following manner.

Wafer height $Z=(Z\text{-data}/n+Z\text{-data}/1)/2$

Wafer position $X=(X\text{-data}/n+X\text{-data}/1)/2+X0$

Wafer position $Y=(X\text{-data}/n-X\text{-data}/1)/1.218+Y0$

Figure 16:
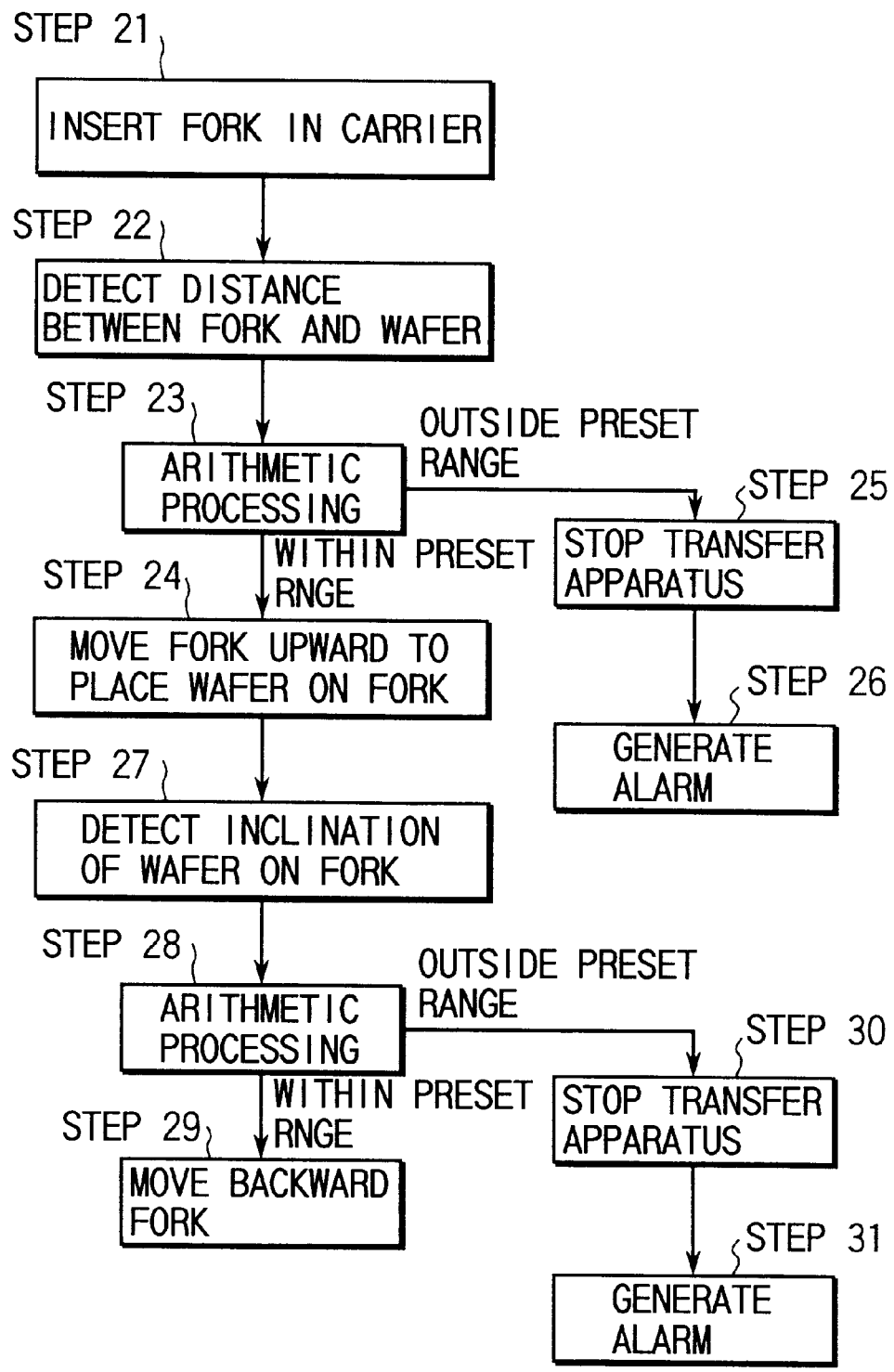
FIG. 16 is a flow chart for schematically explaining a flow employed when a wafer is extracted from the carrier based on the present invention.
Figure 17:
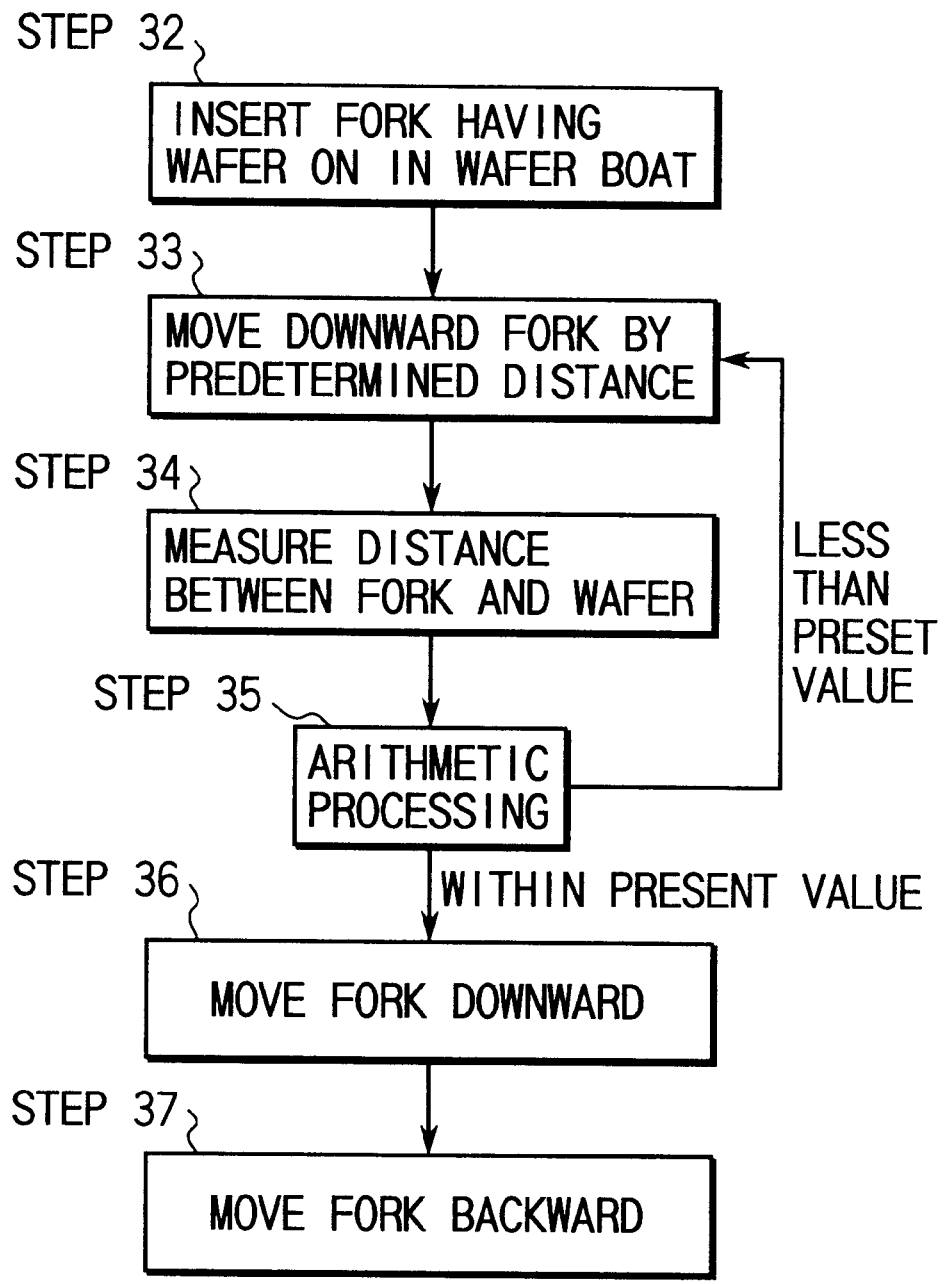
FIG. 17 is a flow chart for explaining a flow employed when the wafer is accommodated in the wafer boat based on the present invention.

The actual wafer transfer operation done by the transfer apparatus of the present invention after teaching is ended will be briefly described with reference to FIGS. 16 and 17. Although the operation of the receiving plate 59b will be described, the receiving plates 59a are operated in the same manner.

First, the arm 51 of the transfer apparatus 20 is moved in the vertical direction (Z direction) in accordance with the basic operation preset in the main controller 63. The level of the receiving plate 59b is thus set to match the target wafer W to be transferred which is accommodated in the carrier C. Also, the arm 51 is turned in the θ direction so that it precisely opposes the carrier C, i.e., so that the center of the front surface of the carrier C is present on the moving line of the receiving plate 59b in the back-and-forth direction. Hence, the arm 51 is set at the transfer operation position with respect to the carrier C. From this state, the receiving plate 59b is moved forward and is inserted under the target wafer W (step 21).

In this state, the distance between the receiving plate 59b and wafer W is detected by the sensors 70a and 70b (step 22).

The main controller 63 performs arithmetic processing based on the detected information and the preset information stored in advance, as described above (step 23).

As the result of the arithmetic processing, if the detection value falls within a preset value range, the receiving plate 59b is moved slightly upward. Then, the wafer W is took up and carried on the receiving plate (step 24).

As the result of the arithmetic processing, if the detected value falls outside the preset value range, the transfer apparatus is stopped (step 25), and an alarm is generated (step 26). Appropriate adjustment is performed, and the operation of the apparatus is resumed.

After the distance between the receiving plate 59b and wafer W is within the preset range and the wafer W is placed on the receiving plate 59b, the inclination of the wafer W is detected by the two sensors 70a and 70b (step 27).

The main controller 63 performs arithmetic processing based on the inclination information sent from the sensors and the preset information stored in advance (step 28).

As the result of the arithmetic processing, if the detection value is within the preset value range, the receiving plate 59b is moved backward, and the target wafer W is extracted from the carrier C (step 29).

As the result of the arithmetic processing, if the detected value falls outside the preset value range, the transfer apparatus is stopped (step 30), and an alarm is generated (step 31). Appropriate adjustment is performed, and the operation of the apparatus is resumed.

Subsequently, the target wafer W is extracted from the carrier C, and the wafer is placed on the receiving plate 59b. Thereafter, the arm 51 is moved in the vertical direction (Z direction) to set the level of the receiving plate 59b to match the support groove in the wafer boat 21 where the target wafer W must be placed, and the arm 51 is turned to precisely oppose the wafer boat 21. From this state, the receiving plate 59b is moved forward, and the receiving plate 59b having the wafer W thereon is inserted in the wafer boat 21 (step 32). At this time, the presence of the wafer on the receiving plate is detected by the sensors 70a and 70b, so that it is confirmed that wafer dropping does not occur and that the transfer operation can be continued.

Subsequently, the receiving plate 59b is slightly moved downward by a predetermined distance (step 33), and the distance between the receiving plate 59b and wafer W is detected by the sensors 70a and 70b (step 34).

The main controller 63 performs arithmetic processing based on the detected information and the preset information stored in advance (step 35).

As the result of the arithmetic processing, if the detection value falls within a preset value range, the receiving plate 59b is moved downward by a predetermined amount. If the detection value is less than a predetermined amount, the receiving plate is moved downward again. This operation is repeated until the amount of downward movement reaches a preset value. The receiving plate is moved downward when the amount of downward movement falls within the preset value range. Therefore, the target wafer W remains on the support groove of the wafer boat 21, so that it is placed in the wafer boat 21 (step S36).

Thereafter, the receiving plate 59b is moved backward and extracted from the wafer boat 21 (step 37).

Convey and transfer operations for the next wafer W are performed through the same operation. The wafers W are transferred from the carrier C to the wafer boat by repeatedly performing these series of operations. When setting wafers in the carrier C and wafer boat, it is usually done sequentially downward. When extracting the wafers, it is usually done upward.

Two controllers, i.e., the interface 81 and the main controller 63, exist to interpret signals from the sensors, because interpretation of analog data shown in FIG. 8 takes time. During an ordinary operation, if the main controller interprets the analog data, the operation may be delayed. Therefore, the analog data is converted into ON/OFF signals by the interface 81, and operation is performed in accordance with the ON/OFF signals. During auto-teaching, signal interpretation is controlled by the main controller even if the speed suffers.

The detailed arrangement of the transfer apparatus according to the present invention is not limited to that of the above embodiment. For example, regarding the handling arm and wafer carrying receiving plates, those having appropriate shapes and drive mechanisms can be used. The wafer support is not limited to what is called a carrier or wafer boat, but various types of wafer supports can be employed.

Further, the present invention can be similarly applied to a transfer apparatus for transferring plate-like processing targets other than the semiconductor wafer, e.g., LCDs and other substrates.

I claim:

1. A transfer apparatus for transferring a substrate between first and second support bodies each supporting a plurality of substrates, comprising:

a transfer apparatus main body vertically movable and movable between a first operation position for transferring a substrate to or from said first support body and a second operation position for transferring a substrate to or from said second support body, a receiving member arranged to be movable back and forth on said apparatus main body to support the substrate and to transfer the substrate to or from said first or second support body, non-contact first and second sensors mounted on two side portions of said receiving member and movable back and forth integrally with said receiving member, and first and second sensors, when moving back and forth along one surface of a selected substrate, detecting a vertical distance to the selected substrate and first and second timings at which said first and second sensors respectively pass by edge portions of the selected substrate, arithmetic means for calculating three-dimensional data of the selected substrate, vertical position data of the three-dimensional position data being calculated on the basis of the vertical distance, and x-directional position data and y-directional position data in a horizontal plane of the three-dimensional position data being calculated on the basis of a difference in back-and-forth distances of said receiving member at the first and second timings, and control means for receiving the three-dimensional data from said arithmetic means and controlling an operation of said transfer apparatus in transferring the selected substrate.

2. A transfer apparatus according to claim 1, wherein said arithmetic means is set to calculate position data of a substrate having a substantially circular outline.

3. A transfer apparatus according to claim 1, wherein said first and second sensors are electrostatic capacity sensors.

4. A transfer apparatus for transferring a substrate between first and second support bodies each supporting a plurality of substrates, comprising:

a transfer apparatus main body vertically movable and movable between a first operation position for transferring a substrate to or from said first support body and a second operation position for transferring a substrate to or from said second support body, first and second receiving members arranged to be movable back and forth on said apparatus main body and vertically stacked on each other to support the substrate and to transfer the substrate to or from said first or second support body, non-contact first and second sensors mounted on two side portions of said first and second receiving members, respectively, and movable back and forth integrally with said first and second receiving members, respectively, said first and second sensors, when moving back and forth along one surface of a selected substrate, detecting a vertical distance to the selected substrate and first and second timings at which said first and second sensors respectively pass by edge portions of the selected substrate, arithmetic means for calculating three-dimensional data of the selected substrate, vertical position data of the three-dimensional position data being calculated on the basis of the vertical distance, and x-directional position data and y-directional position data in a horizontal plane of the three-dimensional position data being calculated on the basis of a difference in back-and-forth distances of said first and second receiving members at the first and second timings, and control means for receiving the three-dimensional data from said arithmetic means and controlling an operation of said transfer apparatus in transferring the selected substrate.

5. A transfer apparatus according to claim 4, wherein said arithmetic means is set to calculate position data of a substrate having a substantially circular outline.

6. A transfer apparatus according to claim 4, wherein said first and second sensors are electrostatic capacity sensors.

7. A heat treatment system for heat-treating a substrate, comprising:

(a) a heat treatment section for heat-treating a substrate, said heat treatment section comprising a heat treatment chamber, a support boat for supporting a large number of substrates, a loading/unloading mechanism for loading/unloading said support boat into/from said heat treatment chamber, (b) a storage section for storing a substrate, said storage section comprising a storage receptacle for storing a plurality of cassettes for supporting a large number of substrates, and a transport mechanism for transporting a cassette between said storage receptacle and a relay stage, and (c) a transfer apparatus for transferring a substrate between said heat treatment section and said storage section, said transfer apparatus comprising a transfer apparatus main body vertically movable and movable between a first operation position for transferring a substrate to or from said support boat and a second operation position for transferring a substrate to or from a selected cassette on said relay stage, a receiving member arranged to be movable back and forth on said apparatus main body to support the substrate and to transfer the substrate to or from said support boat or the selected cassette, non-contact first and second sensors mounted on two side portions of said receiving member and movable back and forth integrally with said receiving member, said first and second sensors, when moving back and forth along one surface of a selected substrate, detecting a vertical distance to the selected substrate and first and second timings at which said first and second sensors respectively pass by edge portions of the selected substrate, arithmetic means for calculating three-dimensional data of the selected substrate, vertical position data of the three-dimensional position data being calculated on the basis of the vertical distance, and x-directional position data and y-directional position data in a horizontal plane of the three-dimensional position data being calculated on the basis of a difference in back-and-forth distances of said receiving member at the first and second timings, and control means for receiving the three-dimensional data from said arithmetic means and controlling an operation of said transfer apparatus in transferring the selected substrate.

8. A heat treatment system according to claim 7, wherein said arithmetic means is set to calculate position data of a substrate having a substantially circular outline.

9. A heat treatment system according to claim 7, wherein said first and second sensors are electrostatic capacity sensors.

10. A heat treatment system for heat-treating a substrate, comprising (a) a heat treatment section for heat-treating a substrate, said heat treatment section comprising a heat treatment chamber, a support boat for supporting a large number of substrates, a loading/unloading mechanism for loading/unloading said support boat into/from said heat treatment chamber, (b) a storage section for storing a substrate, said storage section comprising a storage receptacle for storing a plurality of cassettes for supporting a large number of substrates, and a transport mechanism for transporting a cassette between said storage receptacle and a relay stage, and (c) a transfer apparatus for transferring a substrate between said heat treatment section and said storage section, said transfer apparatus comprising a transfer apparatus main body vertically movable and movable between a first operation position for transferring a substrate to or from said support boat and a second operation position for transferring a substrate to or from a selected cassette on said relay stage, first and second receiving members arranged to be movable back and forth on said apparatus main body and vertically stacked on each other to support the substrate and to transfer the substrate to or from said support boat or the selected cassette, non-contact first and second sensors mounted on two side portions of said first and second receiving members, respectively, and movable back and forth integrally with said first and second receiving members, respectively, said first and second sensors, when moving back and forth along one surface of a selected substrate, detecting a vertical distance to the selected substrate and first and second timings at which said first and second sensors respectively pass by edge portions of the selected substrate, arithmetic means for calculating three-dimensional data of the selected substrate, vertical position data of the three-dimensional position data being calculated on the basis of the vertical distance, and x-directional position data and y-directional position data in a horizontal plane of the three-dimensional position data being calculated on the basis of a difference in back-and-forth distances of said first and second receiving members at the first and second timings, and control means for receiving the three-dimensional data from said arithmetic means and controlling an operation of said transfer apparatus in transferring the selected substrate.

11. A heat treatment system according to claim 10, wherein said arithmetic means is set to calculate position data of a substrate having a substantially circular outline.

12. A heat treatment system according to claim 10, wherein said first and second sensors are electrostatic capacity sensors.

* * * * *